(12) United States Patent
Schultz et al.

(10) Patent No.: US 6,211,514 B1
(45) Date of Patent: *Apr. 3, 2001

(54) DEVICE AND METHOD FOR SENSING WAFER-SHAPED OBJECTS AND SHELVES IN A CONTAINER

(75) Inventors: Klaus Schultz, Jena; Sebastian Kaden, Frankfurt, both of (DE)

(73) Assignee: Brooks Automation GmbH, Jena (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/918,860

(22) Filed: Aug. 26, 1997

(30) Foreign Application Priority Data

Jul. 3, 1997 (DE) .............................. 197 28 478

(51) Int. Cl.[7] .............................. H01J 40/14; B65G 49/07
(52) U.S. Cl. .............................. 250/222.1; 414/937
(58) Field of Search .............................. 250/221.1, 221, 250/559.01, 559.09, 559.08, 559.39, 208.1; 414/331, 267, 273, 275, 936, 937, 416; 356/375, 376, 400

(56) References Cited

U.S. PATENT DOCUMENTS

| | | |
|---|---|---|
| 5,418,382 | 5/1995 | Blackwood et al. . |
| 5,481,382 | 1/1996 | Takahashi et al. . |
| 5,540,098 * | 7/1996 | Ohsawa .............................. 414/937 |
| 5,605,428 * | 2/1997 | Birkner et al. .............................. 414/331 |
| 5,822,213 * | 10/1998 | Huynh .............................. 364/478.01 |

FOREIGN PATENT DOCUMENTS

| | | |
|---|---|---|
| 2924685 | 9/1984 | (DE) . |
| 4013743 | 3/1992 | (DE) . |
| 4306957 | 3/1993 | (DE) . |
| 4311691 | 7/1996 | (DE) . |
| 1953587 | 4/1997 | (DE) . |

OTHER PUBLICATIONS

Austrian Patent Office Service and Information Sector(TRF) search report, examination report, Aug. 7, 1998 8 pages.

* cited by examiner

Primary Examiner—John R. Lee
Assistant Examiner—Kevin Pyo
(74) Attorney, Agent, or Firm—Perman & Green, LLP

(57) ABSTRACT

A device and method for the sensing of wafer-shaped objects and shelves in a container is disclosed. The device and method function to increase the reliability of detection in containers which are open on one side as well as in containers which are open on two sides, and to detect whether a shelf is occupied by more than one object, to detect oblique positions of the objects along several shelves and the position of the shelves themselves independent from dimensional tolerances without impeding the handling of either the wafer-shaped objects or the container and without interfering with clean room conditions. Radiation from a radiation source which is reflected at the front sides of the objects and at the shelves is directed to optoelectronic sensor elements for recording an image by an imaging optical device. The recording of every image is adapted to the reflectance ratios at the front sides which contribute to the imaging. The device and method is applicable in the manufacture of integrated circuits.

30 Claims, 8 Drawing Sheets

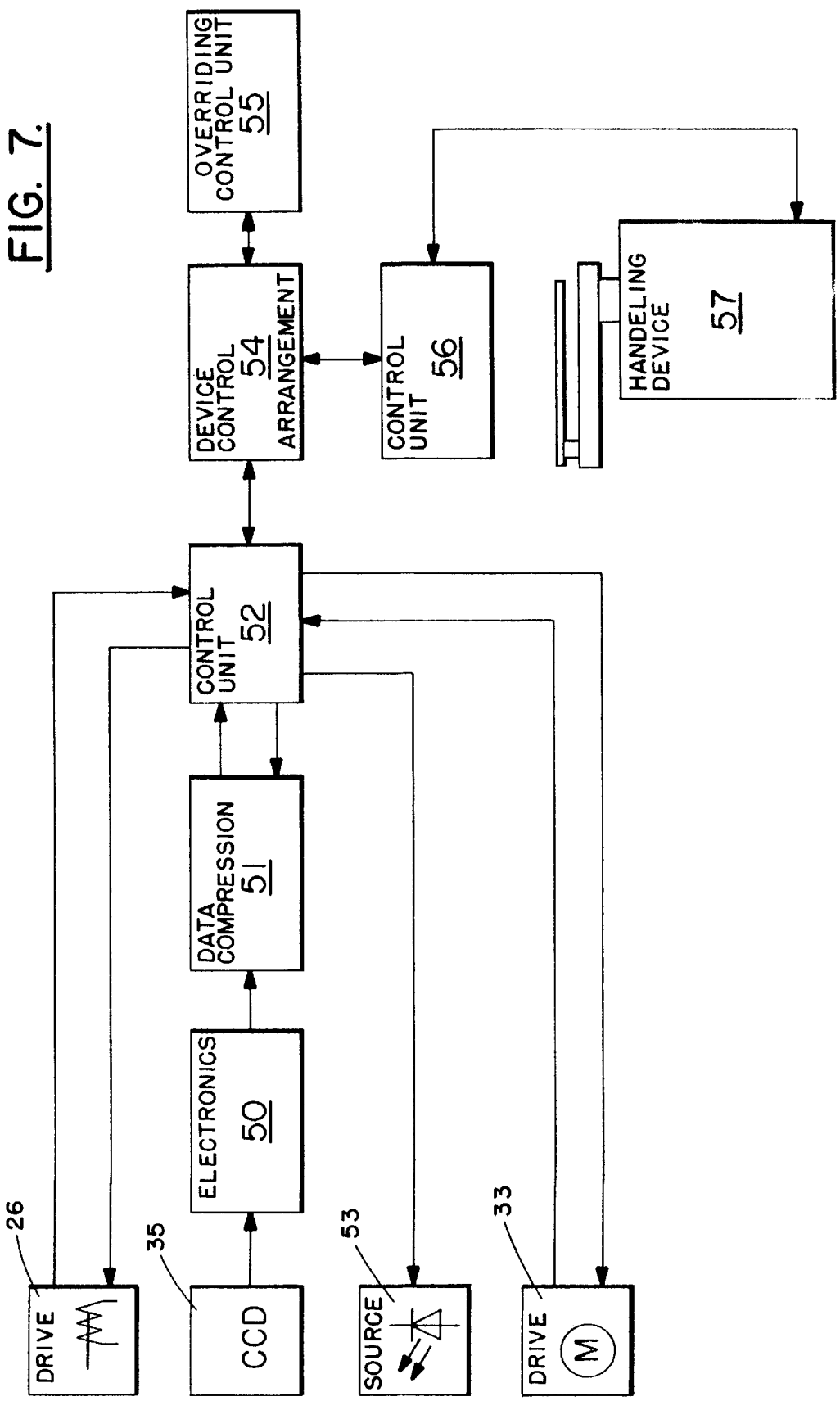

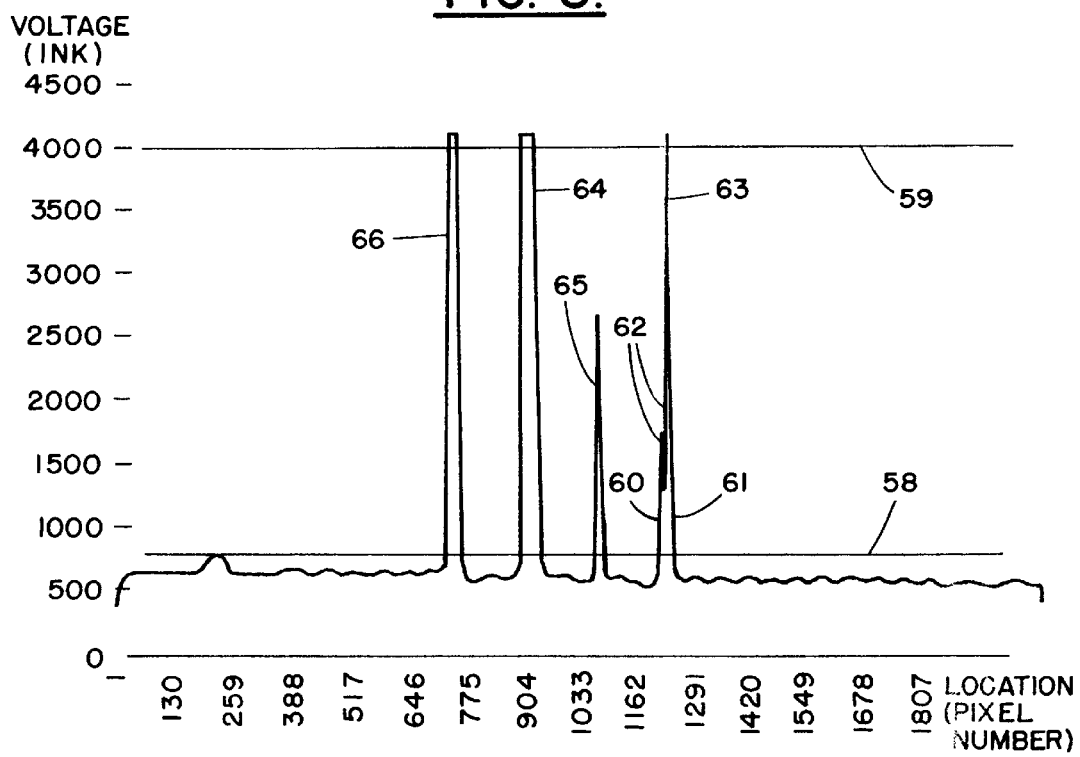
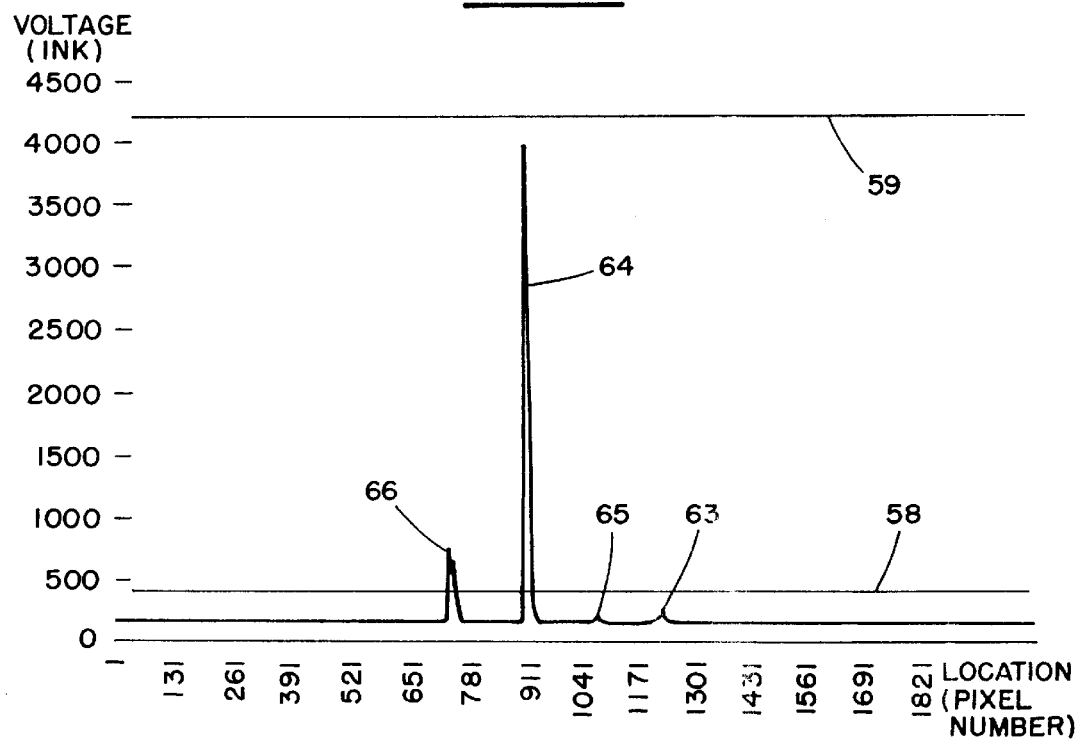

DEVICE AND METHOD FOR SENSING WAFER-SHAPED OBJECTS AND SHELVES IN A CONTAINER

BACKGROUND OF THE INVENTION

1. Field of the Invention

The invention relates to the sensing of wafer-shaped objects and shelves in a container in which the shelves which are arranged substantially parallel to one another serve to receive the objects and radiation from a radiation source which is reflected at front sides of the objects and at the shelves is directed to optoelectronic sensor elements for recording at least one image by means of an imaging optical device.

2. Description of the Related Art

The sensing of semiconductor wafers in the shelves of the storing containers which are used for transporting and storing the semiconductor wafers as well as holding them in readiness during the manufacturing process grows in importance as the automation of manufacturing increases. Of primary importance in this regard is the achievement of maximum reliability in order to prevent damage to the semiconductor wafers during their automated handling. As a rule, the containers that are used have two openings located opposite to one another. As new technology is introduced, such as the storage and transporting of semiconductor wafers in micro-cleanrooms and the merging of the holding receptacles with their outer covering, the opening of this container is often limited to one side which serves simultaneously for the removal of the semiconductor wafers by means of handling devices.

According to U.S. Pat. No. 4,895,486, it is known to determine the presence of wafer-like objects in a carrier (magazine) and their position relative to a reference plane in the carrier by means of a monitoring device in that a first signal for the presence of such an object is combined with a location signal for the object. The first signal is obtained by an optoelectronic sensor which monitors the space in which the objects can be found. The second signal is formed via a position encoder coupled with a drive for moving the carrier up and down. To determine the reference plane and possible holding space of the objects, the space in the carrier is divided vertically into segments. In addition to a segment serving as reference plane and segments without wafer-like objects, window segments in which objects may be present are defined. An indexing of the carrier is effected in that, after the reference plane in the carrier is detected by measuring techniques, the locations of the window segments are determined by and stored in a computer based on construction specifications of the respective carrier being used.

The solution described in Patent DE 4306957 C1 shows a bundle of measurement beams which is emitted by a transmitter and whose center beam lies in the reference plane. This measurement beam bundle is guided between oppositely located walls containing the magazine shelves and is directed to and interrupted by projections of one of the walls, which projections face toward the interior of the magazine and form shelves serving as a support for the disk-shaped objects. As a result of the vertical adjustment in the direction of the magazine shelves which are located one above the other and which accordingly, one after the other, occupy a position in common with the reference plane, an image of the magazine shelves and of the disk-shaped objects located therein is generated by a modulation of the measurement beam bundle.

DE 42 38 834 A1 describes an arrangement which, in addition to a determined construction of a robot for moving semiconductor wafers, also contains, among other things, a sensor arrangement for sensing the presence of these semiconductor wafers in their holding containers. A number of photoreceivers are arranged opposite the holding container in such a way that the photoreceivers are in a spatial relationship to the shelves of the holding containers. An illumination device which is attached to the robot can be moved by the latter into a coordinate relative to the holding container. The signal generated in the photoreceivers during this movement makes it possible to determine the presence of a semiconductor wafer in a shelf allocated to the photoreceiver.

All of the technical solutions mentioned above have the disadvantage that they do not work when used with the above-mentioned containers that are open on one side, since the radiation cannot pass through the holding container. A further disadvantage consists in that a sensing or scanning relative motion is required between the sensor and the substrate. This leads to an increase in the time required for sensing and also to a deterioration of clean room conditions. The latter becomes particularly problematic when the relative movement can only be generated by an adjustment or displacement of the sensor.

U.S. Pat. No. 5,418,382 uses radiation elements which are arranged in a row adjacent to the front sides of the semiconductor wafers. Rod-shaped light waveguides, whose inlet openings are adjacent to the front sides of the semiconductor wafers and whose light outlet openings are adjacent to receiver elements, transmit the reflected light. The described device is limited to detection of substrates in predefined zones and accordingly affords the possibility of detecting a plurality of objects in such a zone; however, it is not possible to detect substrates which are located in different shelves and are accordingly tilted relative to a handling plane.

Due to the fact that it is required to arrange the device in the immediate vicinity of the substrate to be detected, application is limited to containers which are open on two sides as in the other prior art solutions. When containers are used which are open on only one side, the entire device must be removed from the handling area so as to prohibit increased particle contamination.

Beyond this, the use of the device in the immediate vicinity of the substrate impedes the use of SMIF technology and leads to restrictions in automation. The physically large extension of the sensor over the entire height of the container impedes handling of the cassettes with respect to the arrangement directly opposite the substrates and limits the degrees of freedom of possible movements.

The subject matter of DE 195 35 871 A1 also allows the use of magazines or magazine-like containers which are closed on all sides except in the charging direction, but also requires a relative movement. Diffuse scatter light which is formed after a measurement beam bundle impinges on the edge of an object or on an object support is received by a position-sensitive photoreceiver that is usually combined with a sensor in a mechanical constructional unit, and this diffuse scatter light is transformed by means of an electronic amplifier into an analog signal whose value is dependent on the distance between the transmitter and point of incidence. By means of vertical adjustment in the direction of the magazine shelves which are located one above the other, an image of the magazine shelves and of the wafer-shaped objects located in the magazine shelves is generated by means of an amplitude modulation of the output signal brought about by the change in distance between the transmitter and the reflecting object in the plane vertical to the movement direction.

OBJECT AND SUMMARY OF THE INVENTION

The primary object of the invention is to increase the reliability of detection in containers which are open on one side as well as in containers which are open on two sides. It should be possible to detect not only whether a shelf is occupied by more than one object, but also an oblique position of the objects along several shelves and the position of the shelves themselves independent from dimensional tolerances without impeding the handling of either the wafer-shaped objects or the container and without interfering with clean room conditions.

By means of a device for sensing wafer-shaped objects and shelves in a container in which the shelves which are arranged substantially parallel to one another serve to receive objects and in which radiation from a radiation source which is reflected at front sides of the objects and at the shelves is directed to optoelectronic sensor elements for recording at least one image by means of an imaging optical device, the object of the invention is met in that the recording of every image is adapted to the reflectance ratios at the front sides which contribute to the imaging.

The sensor elements and the imaging optical device are arranged in a fixed or stationary manner relative to one another in order to select different regions of the front sides and are adjustable jointly in a plane parallel to the shelves and extending past the front sides.

If only a slight spatial change in the recording elements is required for the selection of different regions of the front sides, it is sufficient to adjust only the imaging optical device in a plane parallel to the shelves and past the front sides.

Otherwise it is advantageous when the sensor elements and the imaging optical device are attached to a common carrier which has an axis of rotation directed vertical to the plane of adjustment in whose direction the sensor elements are arranged adjacent to one another.

It is also advantageous when the imaging optical device for imaging the objects and the shelves contains interchangeable objective lenses for changing the focal length which are carried by a receiving plate. By means of the adjustment of the receiving plate, the interchangeable objective lenses are displaced by their optical axes in the region of the sensor elements.

When using containers which are open only on one side, the sensor elements and the imaging optical device, together with a radiation source, are adjacent to the container at a closed side. A deflecting device ensures a beam path from the interior of the opened container to the sensor elements and to the radiation source.

In the general and usual case of coupling such containers to a semiconductor processing installation for the purpose of transporting wafers, the sensor elements, the imaging optical device and the radiation source are attached to a stationary carrier. A horizontally displaceable platform for receiving and coupling the container to a charging opening in a wall element of the semiconductor processing installation is guided on the carrier. The deflecting device is arranged so as to be offset laterally to the charging opening at the wall element opposite to a region through which radiation can travel.

If there is sufficient free space in front of the opening of the container, the sensor elements and the imaging optical device can be adjacent to the container also at an open side so that the deflecting device can be dispensed with.

An arrangement of this kind can also be used when the container has an open front side and an open rear side as is the case in commonly used wafer magazines.

The subject matter of the invention is further directed to a process for sensing wafer-shaped objects at their front sides and shelves of a container by recording at least one image which is composed of signals of individual sensor elements and in which every signal has a fixed reference to a reference base, wherein the recording of every image is connected with a selection of regions of the front sides to be recorded.

In order to increase the detection reliability, at least one pair of images is taken of different regions of the front sides.

It is advantageous when the signals of every image are compared with an upper threshold value. When the threshold value is exceeded during at least one signal, a new image recording of the same region of the front sides as that in the comparison image is made with a different exposure for adapting the signal quantity.

A changed quantity of objects in the shelves is characterized either by divergences of the measured signal widths for the objects relative to the reference width or by divergences of the distance of the signal maxima for the objects to the reference distances. The latter applies particularly for a signal waveshape between two signal maxima which lies above a lower threshold value.

Divergences between measured positions of the objects and reference positions which change depending on the recorded region of the front side characterize an object lying in different shelves. The divergence can be determined relative to the reference distance of the objects or relative to the reference distance to the reference base.

The invention will be explained more fully in the following with reference to the schematic drawing.

BRIEF DESCRIPTION OF THE DRAWINGS IN THE INVENTION

FIG. 7 shows a block diagram of the device;

FIG. 8 shows a first image which was taken with a first exposure time;

FIG. 9 shows a second image in which the exposure time is reduced compared with FIG. 8;

DESCRIPTION OF THE PREFERRED EMBODIMENTS

Figure 1:
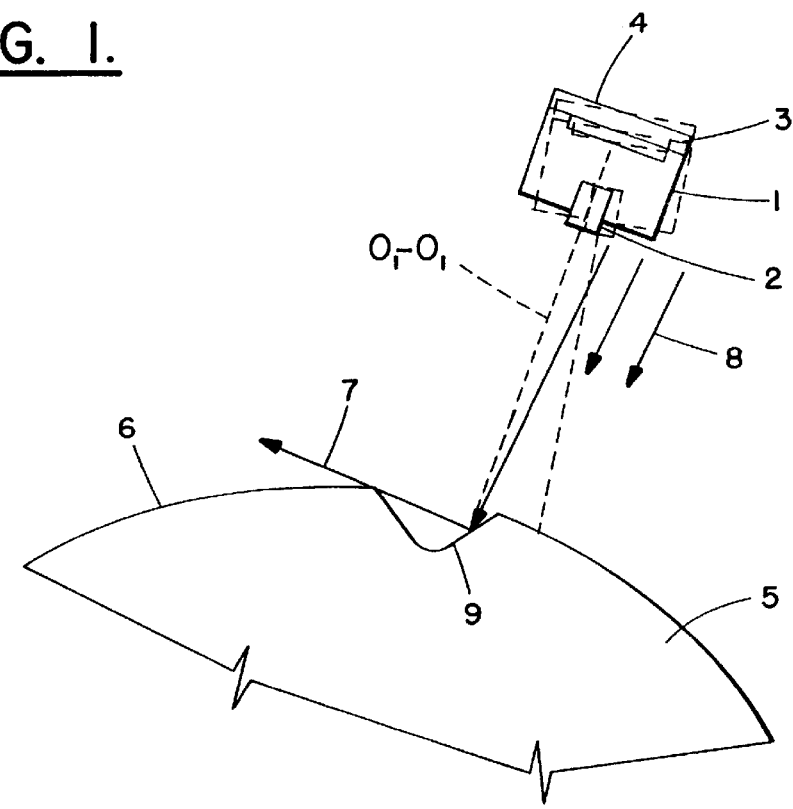
FIG. 1 shows a basic view for the sensing of wafer-shaped objects with direct illumination and a first position of the sensor arrangement.
Figure 2:
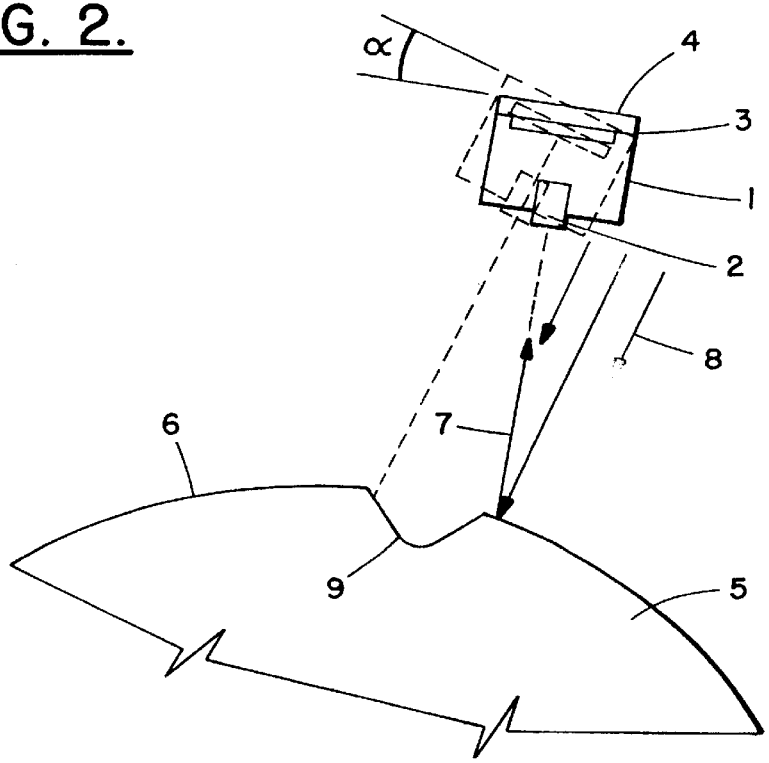
FIG. 2 shows a basic view for the sensing of wafer-shaped objects with direct illumination and a second position of the sensor arrangement.

In FIGS. 1 and 2, a reception device 1 which is formed of an imaging optical device in the form of an objective lens 2, a CCD line sensor 3 with individually addressable sensor elements, and an electronic unit 4 for control and data compression is arranged relative to a wafer-shaped object in the form of a semiconductor wafer 5 in such a way that radiation 7 of a radiation source, not shown, which is reflected by the front side 6 of the semiconductor wafer 5 can be received. Radiation components received by the CCD line sensor 3 are transformed into an electric signal through the use of the photoelectric effect and are fed to the electronic unit 4.

The reflected beam 7 is generated from radiation whose principal radiating direction 8 with optical axis $O_1$—$O_1$ of the objective lens 2 lies substantially in a plane parallel to the surface of the semiconductor wafers 5. The wavelength of the radiation and spectral sensitivity of the CCD line sensor 3 are adapted to one another.

As is shown in FIGS. 1 and 2, the semiconductor wafer 5 has a notch 9 for identifying the lattice orientation, wherein the position of this notch 9 in the plane is not determined in most cases, If the notch 9 lies in the field of view of the reception device 1, then no radiation or only an insufficient portion of radiation is reflected in the direction of the reception device 1 (FIG. 1). For obtaining a signal, it is required to select the reflection direction in which the reflected radiation 7 can be detected by the objective lens 2 to a sufficient extent. For this purpose, the reception device 1 is swiveled by an angle $\alpha$ in a plane parallel to the surface of the semiconductor wafer 5 (FIG. 2), so that another region of the front side 6 is imaged. The reflected radiation now falls on the objective lens 2.

The angle $\alpha$ which depends on the distance between the semiconductor wafer 5 and the reception device 1 and on the imaging scale resulting from the focal length of the objective lens 2 must result at least in the displacement of the viewing location by the width of the notch 9. The opening angle of the radiation source is likewise to be adapted to angle $\alpha$, so that at least a portion of the reflected radiation 7 can also be received after the swiveling of the reception device 1.

Figure 3:
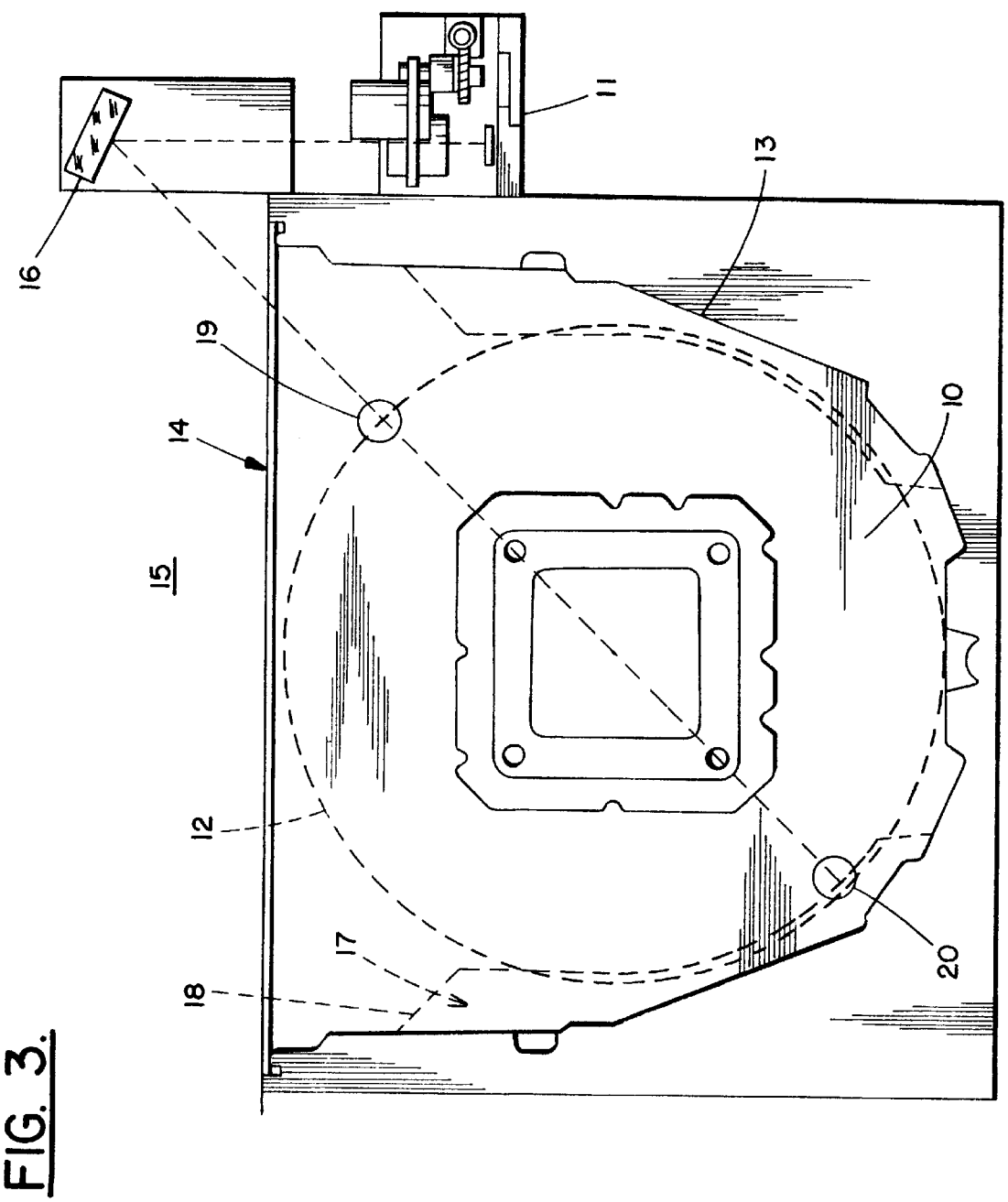
FIG. 3 shows a top view of a container to be opened on one side together with a reception device.

Of course, a displacement of the reception device 1 in a plane parallel to the surface of the semiconductor wafer 5 and vertical to the optical axis $O_1$—$O_1$ instead of the swiveling movement also provides successful results. In order to optimize the opening angle of the radiation source, the movement required for the selection of different regions of the front sides is advantageously executed symmetrical to a center position of the optical axis $O_1$—$O_1$ In order to apply the invention in a container 10 which is open on one side, a reception device 11 for sensing semiconductor wafers 12 according to FIG. 3 is adjacent to the container 10 at a closed side 13 which adjoins the open side 14. Accordingly, a space 15 which serves for the handling and processing of the semiconductor wafer 12 and which is adjacent to the open side 14 of the container 10 remains free and a removal and returning of the semiconductor wafer 12 is not impeded.

In order to maintain this condition, a deflecting device 16 is arranged so as to be offset laterally to the open side 14 of the container 10 for ensuring the required beam path. The semiconductor wafers 12 lie in the container 10 on supports 18 forming shelves 17.

If no semiconductor wafers 12 are located in the shelves 17 or if the container is only partially charged, then it is necessary to shift the depth of focus of a first region 19 to be imaged to a second depth of focus of a second region 20 for changing from the imaging of the semiconductor wafer 12 to an imaging of the shelves 17. For this purpose, the reception device 11 contains imaging optics with variable focal length. The change in focal length is effected either automatically based on the results of a first measurement or on demand to measure unoccupied shelves.

In exceptional cases in which there is sufficient free space in front of the opening of the container, the reception device can also be arranged in front of the opening without a deflecting device.

Figure 4:
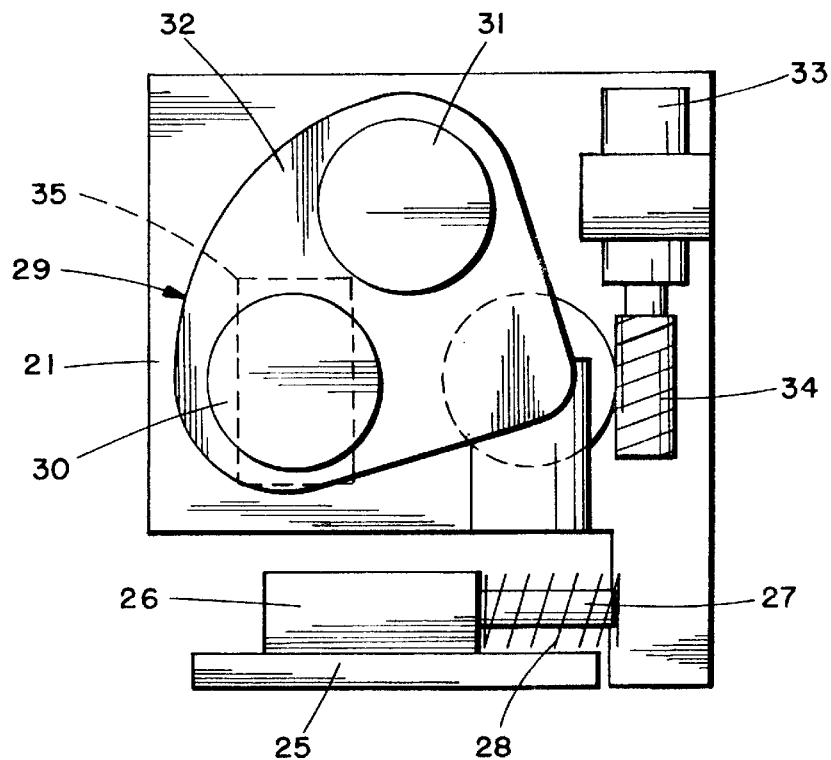
FIG. 4 shows a front view of a swivelable reception device with interchangeable objective lenses.
Figure 5:
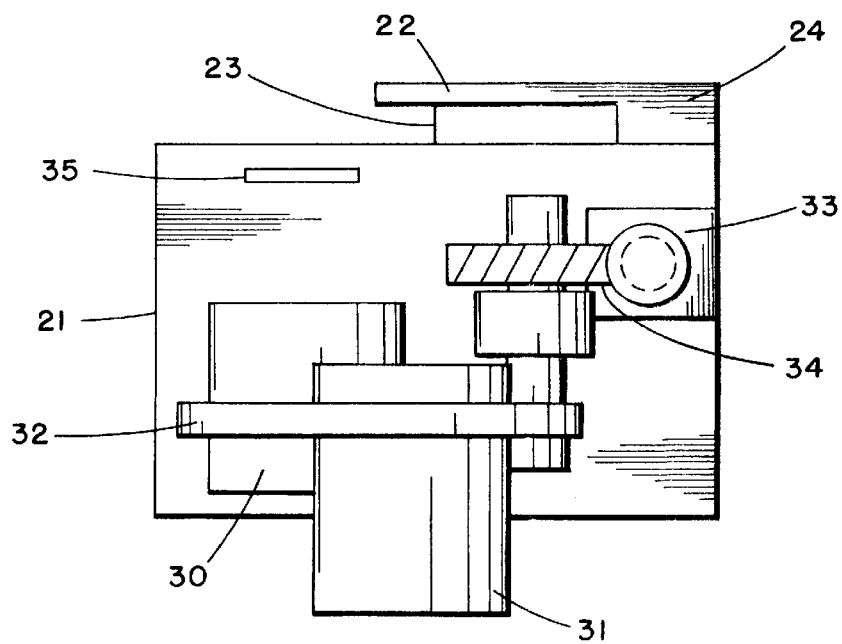
FIG. 5 shows a top view of a swivelable reception device with interchangeable objective lenses.

The embodiment form of a reception device 21 shown in FIGS. 4 and 5 is suitable with respect to its construction for making a recording of an image depending on the reflectance ratios contributing to the imaging at the front side by means of a selection of front side regions that are different from one another.

Accordingly, images can be taken of the different regions of the front sides of the semiconductor wafers in that the entire reception device 21 is adjusted by a small angle in a plane parallel to the surface of the semiconductor wafers. The axis of rotation 22 lies in the rear region of the reception device 21 in a leaf spring joint 23 which is carried by a frame 24 and is pretensioned in the opposite direction to that of the deflection. A linear movement which is generated by means of a plunger coil or moving coil 26 fastened on a base plate 25 acts on an eccentric application point 27 and adjusts the entire reception device 21. The required restoring force during currentless switching of the moving coil 26 is generated by a spring 28.

If only a small local change in the receiving elements is required for the selection of different regions of the front sides, an adjustment of only the imaging optical device can be sufficient. Suitable means for this purpose are sufficiently known to the person skilled in the art.

An imaging optical device 29 with changeable focal length is formed of two objective lenses 30, 31 which are carried by a receiving plate 32. By means of an electric motor device 33, the objective lenses 30, 31 can be moved on a circular path via a gear unit 34 in such a way that their optical axes are displaced in the respective end positions in the region of the CCD sensor 35. The focal lengths of the objective lenses 30, 31 and their distances to the CCD sensor 35 are so adapted as to result in identical imaging scales. Another type of exchange of objectives can be realized by means of a translatory drive, not shown, which moves the objective lenses on a guide path vertical to the optical axis. An exchange of the objective lenses or a zoom objective lens with computer-aided compensation of the imaging scale in the form of a correction matrix are also possible.

The illumination device (not shown) is arranged above and below the reception device 21 in a symmetrical manner and is mechanically connected therewith or fastened separately to the frame.

Figure 6:
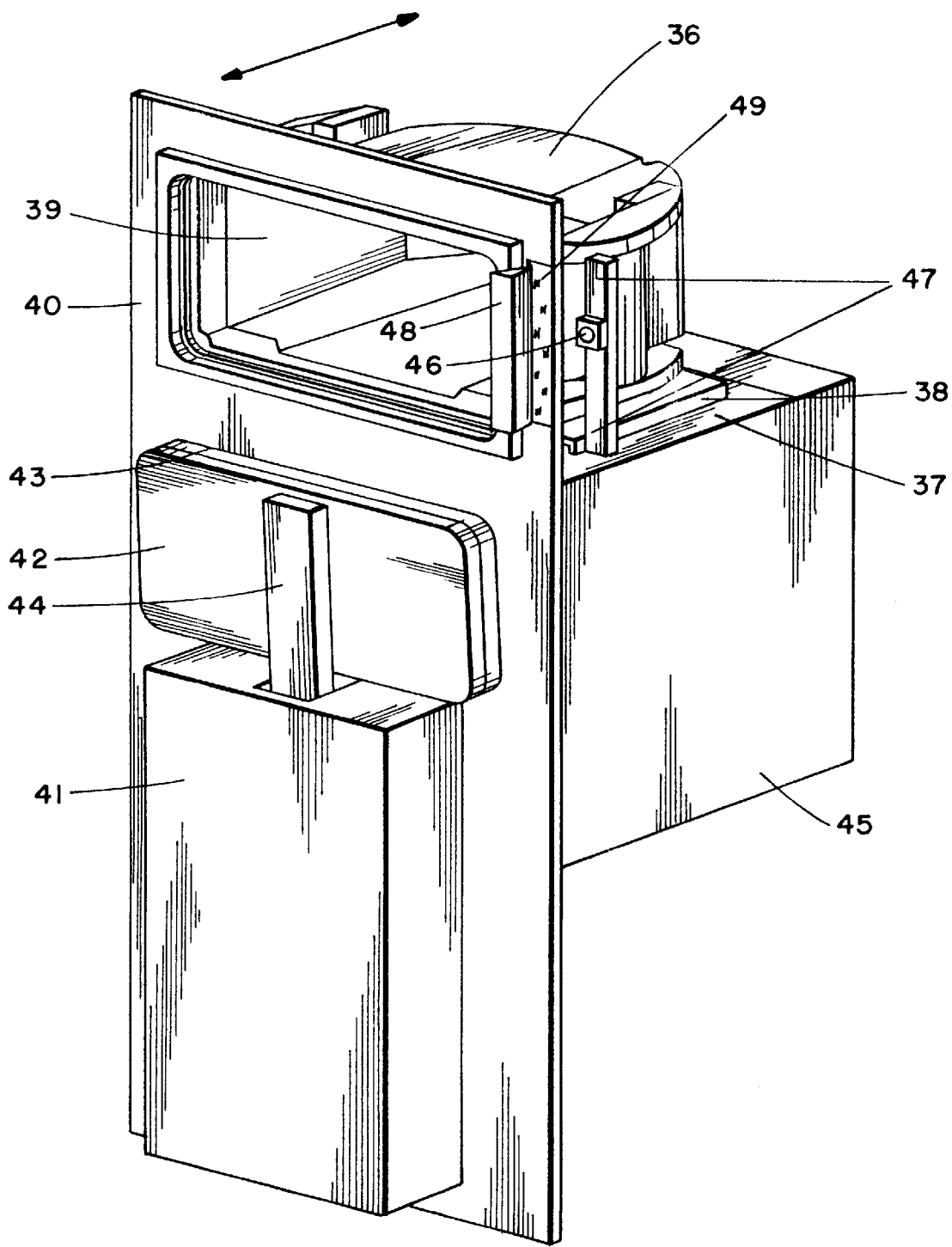
FIG. 6 shows the arrangement of a reception device at a loading and unloading station for semiconductor processing installations with a container which is to be opened at one side, shown in the coupled and opened state.

In the loading and unloading station shown in FIG. 6 for semiconductor processing installations, a container 36 which is already open is placed on a platform 38 which is carried by a stationary carrier 37 and displaceable horizontally in the direction of the arrow and is coupled to a charging opening 39 in a wall element 40. A device 41 for opening and closing the charging opening 39 is constructed for the purpose of jointly receiving a closure 42 for the charging opening 39 and a container cover 43 for the container 36 so that it may be lowered into the semiconductor processing installation.

The closure 42 is attached to an arm 44 which is adjustable with respect to height and with respect to the wall element 40 and can carry the container cover 43 which is coupled by means of frictional engagement. The vertical adjustment and the adjustment of the arm 44 relative to the wall element 40 is effected via lifting cylinders in the interior of the device 41. Drive elements and control elements of the loading and unloading station are accommodated in a housing 45.

A reception device 46, together with a radiation source or illumination source 47, is adjacent to the container 36 at a closed side which adjoins the side to be opened in that its fastening is effected on the carrier 37. Accordingly, the region of the charging opening 39 remains free for handling, and the removal and returning of the semiconductor wafers is not impeded. A deflection device 48 is arranged at the wall element 40 so as to be offset laterally to the charging opening 39, wherein the wall element 40 is provided in this region with a window 49 through which radiation can pass.

Due to the fact of its fixed arrangement with respect to the frame, the reception device 46 is in a fixed geometrical relationship with the same reference base as a handling device in the semiconductor processing installation. If the position of the semiconductor wafer is determined, a positioning of the handling device relative to the semiconductor wafers is effected by means of transferring the vertical location information.

In the block diagram shown in FIG. 7, an optoelectronic transducer in the form of a line-type CCD sensor 35 is connected on the input side and output side with evaluating electronics 50 serving for control and data processing. The analog voltage at the output of the CCD sensor 35 which can be associated with every picture point and which is proportional to the radiation incidence is digitally converted by the evaluating electronics 50. Data compression 51 connected with the evaluating electronics 50 takes over the data selection in that only those received digital voltage values which exceed a lower threshold value are transmitted via a data line to a control unit 52.

Further, there are connections from the control unit 52 to a radiation source or illumination source 53, to the control of the drive 26 for the movement of the reception device 21 and of the drive 33 for the changing of objective lenses. The results of the signal valuation containing information about the contents or occupancy of a shelf, about the position of the semiconductor wafers in the shelves (cross wafers), about possible double occupancy of shelves, and about the distance of the individual objects or shelves from the reference plane are supplied to a device control arrangement 54 via a serial data line. Information concerning the occupancy of the shelves can be demanded by or sent on to an overriding control unit 55.

It is further provided that the device control arrangement 54 supplies the occupancy of the shelves and also the spacing of the individual semiconductor wafers/shelves of a control unit 56 for a handling device 57 for their positioning.

FIG. 8 shows a typical waveshape of a signal received by the reception device over the entire working range of 2048 pixels. For the purpose of data reduction by means of compression 51, a lower threshold value 58 is set which is adjustable in dependence on the integration time (exposure time) of the CCD sensor 35 by means of software and which stands out sufficiently from the base signal (noise) brought about by interference and environmental influences. An upper threshold value 59 which is likewise adjustable by means of software enables the detection of a possible overload and is selected in the neighborhood of the maximum output signal.

The edge 60 with the positive rise and the edge 61 with the negative rise describe the presence of a semiconductor wafer, wherein the position of the semiconductor wafer relative to a reference plane can be calculated from the address of the sensor elements of the CCD sensor 35. The average value is advisably determined from the difference of the addresses between the flanks 60 and 61 and is taken as a basis for the center position of the semiconductor wafers.

By determining the maxima 62 and 63 and evaluating the distance between the two maxima 62 and 63, it is possible to determine whether or not a shelf has double occupancy. The distance between the two maxima 62 and 63 amounts to only a few picture points and differs perceptibly from the standard distance between semiconductor wafers in the shelves. The sequence of two maxima 62 and 63 without a value falling below the lower threshold value 58 in the interim between the two maxima is typical of double occupancy of a shelf. A further possibility for detecting double occupancy of shelves consists in valuating the difference between the positive edge 60 and the negative edge 61.

If a maximum exceeds the selected upper threshold value 59, it is expected that the receiver is overloaded. This applies to maxima 64 and 66 in the present instance. In order to enable a more reliable evaluation of the double maxima, it is necessary to reduce the intensity. This is effected either by means of reducing the illumination intensity or by reducing the integration time of the CCD sensor 35.

In FIG. 9, the signal intensity is reduced in that the exposure time of 30 ms in the first image is reduced to 1 ms. Because of the lower noise resulting from a reduced exposure time, the lower threshold 58 can be reduced. The maxima 64 and 66 are now available to all required evaluating steps.

The distance between the signals 63 and 65 is normally equal to the shelf spacing or, when the shelves are unoccupied, amounts to a multiple of the shelf spacing. In addition, in the case of a fixed arrangement of the reception device there is a fixed relationship to the reference base which was already described. Differences of the measured position from the reference position relative to the reference base or of the distance between the semiconductor wafers relative to the reference distance allows conclusions to be made about semiconductor wafers (cross wafers) placed in two different shelves. The amount of the deviation of the determined position from the shelf spacing or the expected position depends on the position of the measurement location between the side walls of the container, i.e., on the recorded region of the front side, and has its maximum in the center at half of the shelf distance.

Figure 10:
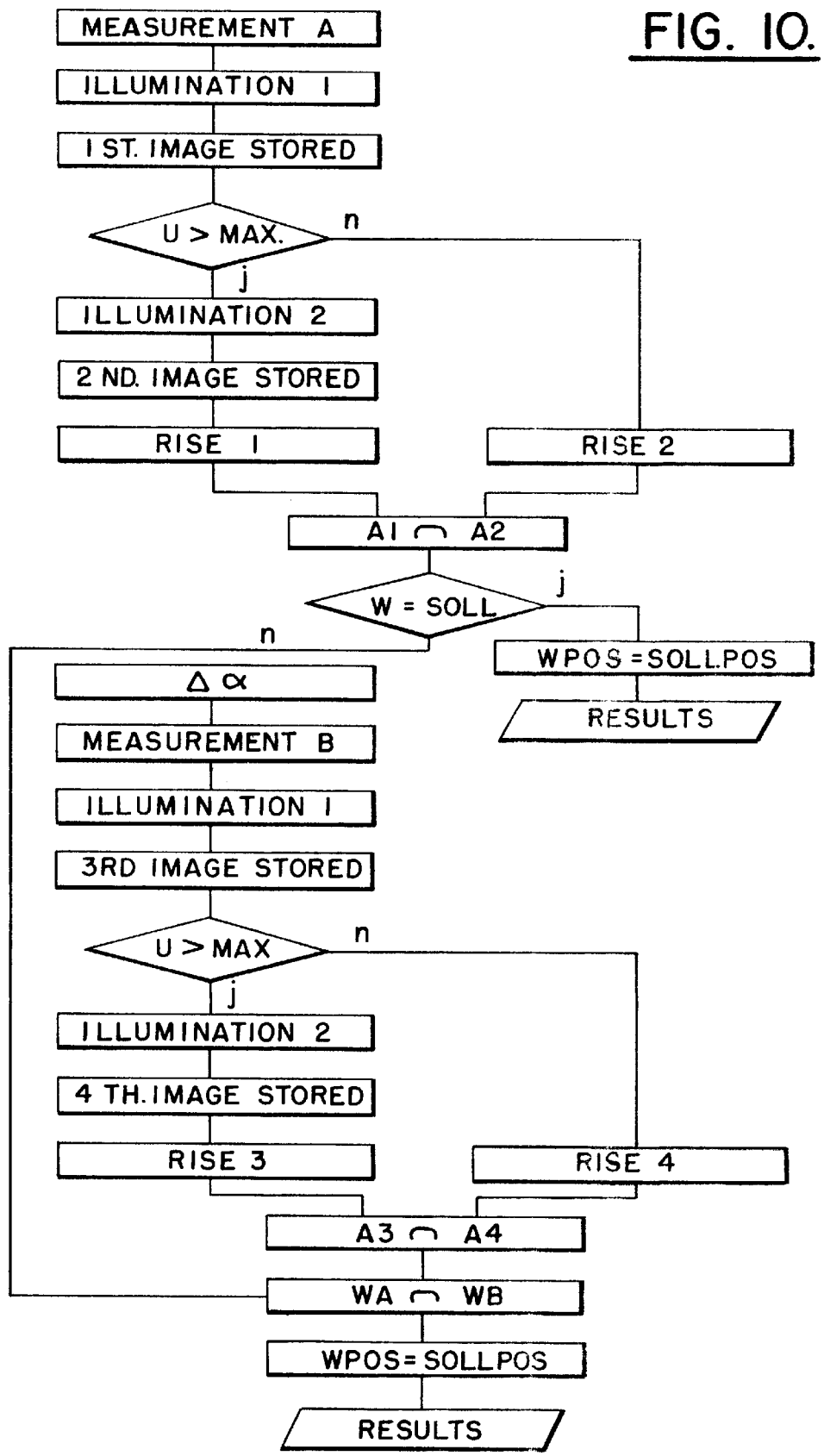
FIG. 10 shows a flow chart for the measurement sequence for determining the presence of objects in the shelves of the container.

According to FIG. 10, a first image is recorded and stored during measurement A at a first integration time or illumination intensity. If the selected upper threshold 59 is exceeded in at least one picture point which is known by its address, a second image with reduced integration time or illumination intensity is recorded and stored. The factor of this change in exposure can be selected as a function of the anticipated fluctuation in the reflectance of the semiconductor wafer and lies at most in a range from 1:30 to 1:50. The usable dynamic range of the sensor is established by the selection of the lower and upper threshold value 58, 59 and is approximately 1:10. Since the entire dynamic range results from the product of the sensor dynamic range and the exposure dynamics, this results in a required change in the integration time or illumination time by the factor of 5. Accordingly, with two images the entire dynamic range can be detected. Information on the presence of semiconductor wafers results from the valuation of the leading edges of the first image, and insofar as the respective signal has not exceeded the selected upper threshold value, information about shelves containing two objects is to be obtained from the valuation of the distance between the maxima.

The valuation of the rises of the second image supplies information about shelves with double occupancy for the semiconductor wafers which were overcontrolled in the first image. The OR operation between the results A1 and A2 of the two images gives information on the shelf occupancy and double occupancy, if any. If the sum of the detected semiconductor wafers corresponds to the number of expected semiconductor wafers (shelf number), W=Soll, then the comparison of the determined wafer positions $W_{pos\ n}$ with reference position $Soll_{pos\ n}$ is effected, where n is the number designating the position of a semiconductor wafer or a shelf. FIG. 10 shows a simplified view of the sequence for one position. If the difference between the reference position and actual position exceeds a value dependent on the measurement location between the walls of the container, then an error message results for the identification of semiconductor wafers supported in two different shelves.

If not all of the semiconductor wafers that were expected are detected or if it is expected that the semiconductor wafers lie in the container with their notches 9 in a disordered manner, then in order to increase the reliability of detection of the semiconductor wafers a measurement B is carried out with a third and, if necessary, a fourth image and the results are stored. Before this, the measurement location is changed by a movement of the reception device corresponding to the view in FIGS. 1 and 2. While the recording of an image of another region of the front sides other than that in measurement A is effected, the valuation algorithm for the images is the same.

The results $W_A$ and $W_B$ of measurements A and B are valuated by an OR operation and provide the overall results. The determined positions $W_{pos}$ are compared with the reference positions $Soll_{pos}$. If the difference between the reference position and actual position exceeds a value dependent on the measurement location, an error message results. The results obtained for each shelf are a status report containing the following information: occupied, free, double-occupied or cross wafers.

In order to use the device according to the invention for determining the exact position of the semiconductor wafers and the shelves relative to the reference plane, the positions of the detected semiconductor wafers and shelves are sent in addition to the status report. The position is contained in the address of the respective sensor element and can be converted into a geometrical distance to the reference plane taking into account the imaging scale and grid or raster dimensions of the sensor elements.

In order to improve accuracy, it is useful to correct errors which are brought about, e.g., by distortions of the objective lenses. In order to determine the correction values, the imaging of a known dimensional embodiment is effected on the sensor and the determined deviations are stored in a correction matrix. The entire measurement arrangement can be calibrated by means of these correction values.

Figure 11:
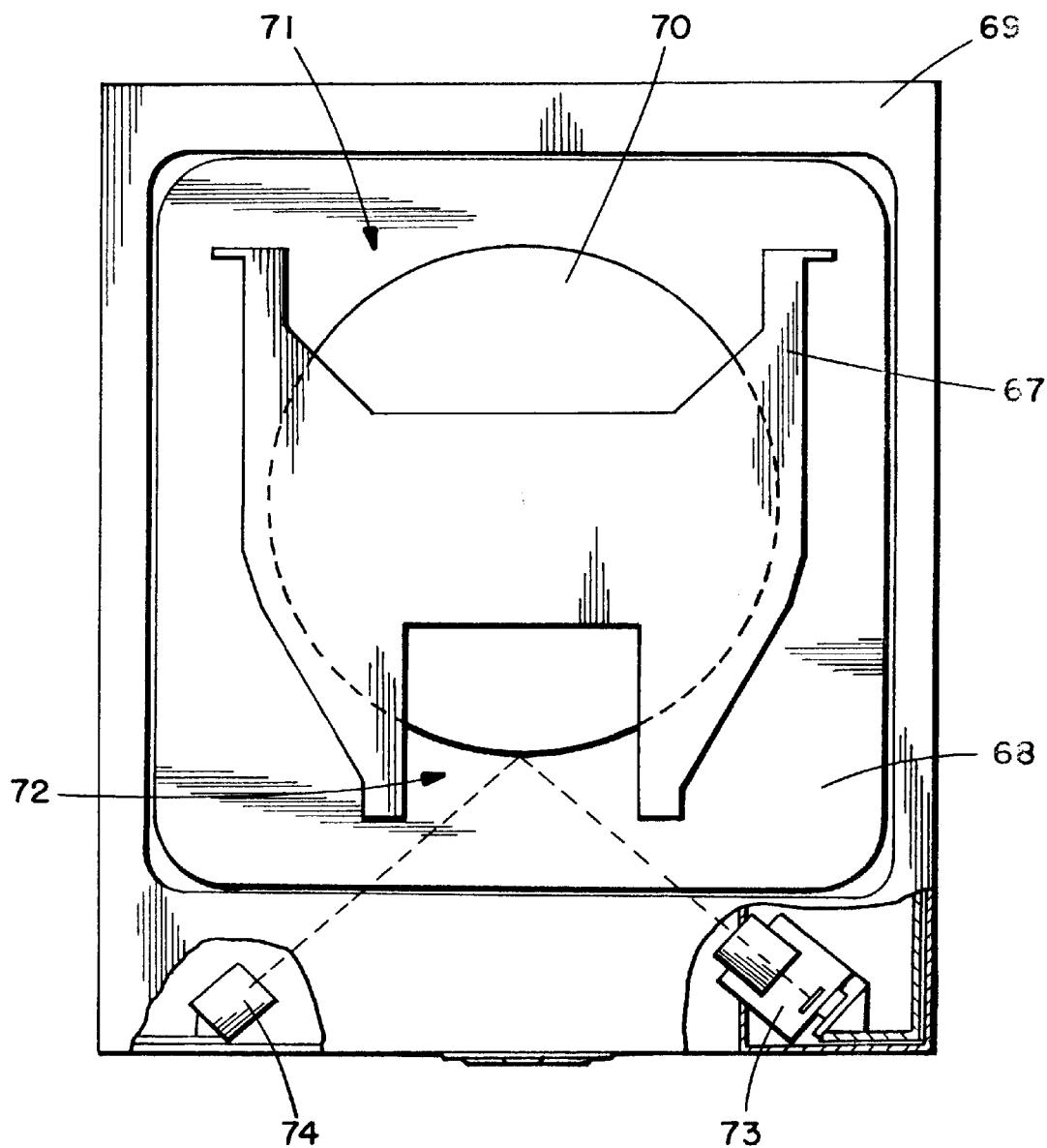
FIG. 11 is a schematic top view of an arrangement for a container which is open on two sides.

In the arrangement shown in FIG. 11, a magazine 67 is placed on a platform 68 which is enclosed by a frame 69. Semiconductor wafers 70 are slid into shelves in the magazine 67 as in the case of the container 10. However, a substantial difference consists in that the magazine 67 is open at its front side 71 and at its rear side 72. Whereas the handling of the semiconductor wafers 70 can be effected at its front side 71, a reception device 73 and an illumination device 74 are arranged separately from one another at the rear side in such a way that the radiation reflected by the illumination device 74 enters the reception device 73. The reception device 73, like the device in FIGS. 4 and 5, has means for simultaneous adjustment of the objective lens and CCD sensor for recording images of different areas of the front sides of the semiconductor wafers 70. The measurement sequence for determining the presence of semiconductor wafers 70 in the shelves of the magazine 67 is the same as that shown in FIG. 10.

While the foregoing description and drawings represent the present invention, it will be obvious to those skilled in the art that various changes may be made therein without departing from the true spirit and scope of the present invention.

What is claimed is:

1. A device for sensing shelves in a container and wafer-shaped objects carried on the shelves, said device comprising:

an opto-electronic sensor for receiving radiation reflected from a first set of the objects, a mover connected to the sensor, the mover comprising a motor for moving the sensor for enabling a region of sides, or edges, of the first set of objects, from which reflected radiation is received, to be varied and thereby sensing different reflected radiation images of the sides or edges, evaluation means for storing a plurality of the images sensed by said sensor, and control means responsive to the evaluation means for adjusting said mover and thereby move said sensor for sensing the first set of objects based upon one of the images of the first set of objects previously sensed by the sensor.

2. The device of claim 1 further comprising a receiving arrangement, wherein said receiving arrangement includes an objective lens together with said opto-electronic sensor, and a radiation source disposed on opposite sides of the sensor.

3. The device of claim 2, wherein the receiving arrangement is movable along a plane which is parallel to the sides of said wafer-shaped objects.

4. The device of claim 3, wherein the receiving arrangement is fixed on a support having an axis of rotation, and the opto-electronic sensor comprises sensor elements which are disposed adjacent to one another in a direction of movement of the receiving arrangement.

5. The device of claim 2, wherein the receiving arrangement and the radiation source are directed towards an open face of the container.

6. The device of claim 2, wherein the receiving arrangement and the radiation source are adjacent to the container on a closed face thereof and a beam deflecting arrangement is provided to ensure a beam path from the interior of the container via an open face to the sensor and to the radiation source.

7. The device of claim 6, wherein the receiving arrangement and the radiation source are fixed on a stationary support which carries a horizontally displaceable platform for receiving and coupling the container to a feed opening in a wall element of a semiconductor processing installation, and the deflecting arrangement is laterally offset with respect to the feed opening on the wall element.

8. The device of claim 2, wherein the receiving arrangement is directed towards an open side of a container which has an open front face and an open rear face.

9. A device for sensing shelves in a container and wafer-shaped objects carried on the shelves, said device comprising:

an opto-electronic sensor for receiving radiation reflected from a first set of the objects, a mover connected to the sensor for moving the sensor for enabling a region of sides, or edges, of the first set of objects, from which reflected radiation is received, to be varied and thereby sensing different reflected radiation images of the sides or edges, evaluation means for storing a plurality of the images sensed by said sensor, and control means responsive to the evaluation means for adjusting said mover and thereby move said sensor for sensing the first set of objects based upon one of the images of the first set of objects previously sensed by the sensor, and further comprising:

an imaging optical arrangement for imaging of the objects and of the shelves, said optical imaging arrangement further comprising interchangeable objectives for varying the focal length borne by a receiving plate, so that movement of the receiving plate displaces the interchangeable objectives with their optical axes into registration with the opto-electronic sensor.

10. A process for sensing shelves of a container and wafer-shaped objects carried on the shelves, said process comprising the steps of:

providing an opto-electronic sensor for receiving radiation reflected from edges of said wafer-shaped objects and said shelves, and recording a plurality of images which are composed of signals from said opto-electronic sensor of a same set of the objects, wherein successive images comprise signals from the sensor of different areas of the edges of the objects from which the reflected radiation is received, and selection of the area of one of the successive images is set as a function of data contained in a previous one of the recorded images.

11. The process defined in claim 10, wherein, to increase the certainty of detection, records are made of various areas of end faces of the objects.

12. The process defined in claim 10, wherein signals contained in the images are compared with an upper threshold value and, when the threshold value is exceeded in the case of at least one signal, a new image is recorded with changed illumination from the same area of the end faces as in the previous image for adaptation of the signal magnitude.

13. The process defined in claim 11, wherein the number of objects on a shelf is determined by deviations of measured signal widths for the objects with respect to a nominal width.

14. The process defined in claim 11, wherein the number of objects on a shelf is determined by deviations of the spacing of maximum signal values for the objects with respect to a nominal spacing.

15. The process defined in claim 14, wherein the number of objects on a shelf is determined by a signal sequence between two maximum signals which lie above a lower threshold value.

16. The process defined in claim 11, wherein a particular shelf on which an object is lying is determined by the recorded region of an end face of the object.

17. A process for sensing at least one wafer-shaped object on a shelf comprising steps of:

providing an opto-electronic sensor for receiving radiation reflected from an edge of the at least one wafer-shaped object, and recording a plurality of images which are composed of signals from the opto-electronic sensor where successive images comprise the signals from the sensor of different respective regions of the edge of the at least one object from which reflected radiation is received in recording of the successive images, and the region for a successive one of the regions is based upon data contained in a previous one of the images, wherein the number of objects on the shelf is determined by deviations of measured signal widths for the objects with respect to a nominal width.

18. A process for sensing at least one wafer-shaped object on a shelf comprising steps of:

providing an opto-electronic sensor for receiving radiation reflected from an edge of the at least one wafer-shaped object, and recording a plurality of images which are composed of signals from the opto-electronic sensor where successive images comprise the signals from the sensor of different respective regions of the edge of the at least one object from which reflected radiation is received in recording of successive images, and the recording conditions for an image are set as a function of data contained in a previous image, wherein the number of objects on the shelf is determined by deviations of the spacing of maximum signal values for objects with respect to a nominal spacing.

19. An apparatus for sensing a semiconductor substrate, the apparatus comprising:

an energy receiver comprising a sensor, the energy receiver being positionable relative with the substrate at a first position for the sensor to sense a first image of a first area on an edge of the substrate based upon energy reflected off of the first area; and a mover connected to the energy receiver, the mover comprising a motor for moving at least a portion of the energy receiver from the first position to a second position, the second position comprising the energy receiver being positioned relative with the substrate for the sensor to sense a second image of a second area on an edge of the same substrate based upon energy reflected off of the second area.

20. An apparatus as in claim 19 wherein the mover is adapted to move the energy receiver in a plane parallel to a planar surface of the substrate.

21. An apparatus as in claim 19 further comprising a deflecting device located in a reflected energy path between the edge of the substrate and the energy receiver.

22. An apparatus as in claim 19 wherein the energy receiver comprises at least two different lens which are selectively positionable in front of the sensor.

23. An apparatus as in claim 19 further comprising an energy emitter for directing energy at the edge and a controller for selectively varying intensity of the energy emitted from the energy emitter.

24. An apparatus for sensing a semiconductor substrate, the apparatus comprising:

an energy receiver comprising a sensor, the energy receiver being positionable relative with a side edge of the substrate for the sensor to sense a first image of a first area on the side edge based upon energy reflected off of the first area;

a reflector located in a path of the reflected energy between the side edge and the sensor; and a mover for moving the path of the reflected energy such that the sensor receives the reflected energy from a second area on the side edge of the substrate, wherein the mover comprises a motor, and wherein the sensor can sense two different areas on the edge of the substrate.

25. A method for sensing a presence of a semiconductor substrate on a support comprising steps of:
- sensing a first image measurement of a first location, the first location comprising an expected location of the substrate on the support, the first image measurement being of a first area on a side edge of the substrate when the substrate is on the support;
- sensing a second image measurement of the first location, the second image measurement being of a second area on the side edge of the substrate when the substrate is on the support; and
- determining whether the substrate is present on the support based upon the first and second image measurements, wherein the step of sensing the second image measurement comprises moving a sensor by a motor from a first position, in which the first image measurement is taken, to a second position.

26. A method as in claim 25 wherein the step of sensing the second image measurement is selectively performed based upon whether or not the step of sensing the first image measurement determines that the substrate is present on the support.

27. A method as in claim 25 wherein at least one of the steps of sensing the first and second image measurements comprises sensing once at a first sensed energy intensity and sensor integration time, and sensing again at an at least partially different second sensed energy intensity and sensor integration time.

28. A method as in claim 25 further comprising sensing a width of the substrate on the support.

29. A method as in claim 28 further comprising determining a deviation of the sensed width with respect to a nominal width.

30. A method as in claim 25 further comprising determining a deviation in spacing between substrates with respect to a nominal spacing, the step of determining being based upon the steps of sensing at the first location and a step of sensing a second substrate at a second location.

* * * * *